(12) United States Patent
Maier et al.

(10) Patent No.: US 9,338,917 B2
(45) Date of Patent: May 10, 2016

(54) ARRANGEMENT HAVING A FIRST PERIPHERAL DEVICE AND A SECOND PERIPHERAL DEVICE

(71) Applicant: Siemens Aktiengesellschaft, Munich (DE)

(72) Inventors: Willi Maier, Oppenau (DE); Norbert Rottmann, Landau (DE)

(73) Assignee: Siemens Aktiengesellschaft, Munich (DE)

( * ) Notice: Subject to any disclaimer, the term of this patent is extended or adjusted under 35 U.S.C. 154(b) by 85 days.

(21) Appl. No.: 14/268,645

(22) Filed: May 2, 2014

(65) Prior Publication Data
US 2014/0328028 A1    Nov. 6, 2014

(30) Foreign Application Priority Data

May 3, 2013    (EP) .................................... 13166500

(51) Int. Cl.
*H05K 7/00*    (2006.01)
*H05K 7/02*    (2006.01)
*G05B 19/05*    (2006.01)

(52) U.S. Cl.
CPC .............. *H05K 7/026* (2013.01); *G05B 19/052* (2013.01)

(58) Field of Classification Search
USPC ......... 361/728–732, 807, 810, 752, 796, 800; 714/49, 52, 800
See application file for complete search history.

(56) References Cited

U.S. PATENT DOCUMENTS

| | | | | |
|---|---|---|---|---|
| 4,738,632 | A | * | 4/1988 | Schmidt et al. ............... 439/341 |
| 5,392,424 | A | * | 2/1995 | Cook .............................. 714/52 |
| 5,777,874 | A | * | 7/1998 | Flood et al. ..................... 700/82 |
| 6,307,153 | B2 | * | 10/2001 | Imoto ............................. 174/50 |
| 6,549,034 | B1 | | 4/2003 | Pietrzyk et al. |

OTHER PUBLICATIONS

Siemens-Catalog ST PCS Jun. 7, 2012; Process Control System SIMATIC PCS 7; 2012.
Siemens-Catalog ST PCS Jun. 7, 2012; Process Control System SIMATIC PCS 7; 2012; the whole document.

* cited by examiner

*Primary Examiner* — Hung S Bui
(74) *Attorney, Agent, or Firm* — Cozen O'Connor

(57) ABSTRACT

An arrangement having a first peripheral device and a second peripheral device that each include basic modules that are provided with process connections and that accommodate electronic modules, where a redundancy adapter unit is provided for redundantly connecting a field device to one of the basic modules of each of the two peripheral devices such that the redundancy connection of assemblies, which are arranged in spatially separate peripheral devices, is suitable simplified.

2 Claims, 1 Drawing Sheet

ARRANGEMENT HAVING A FIRST PERIPHERAL DEVICE AND A SECOND PERIPHERAL DEVICE

BACKGROUND OF THE INVENTION

1. Field of the Invention

The invention relates to an arrangement having a first peripheral device and a second peripheral device each having basic modules that are provided with process connections and accommodate electronic modules, where a redundancy adapter unit is provided for redundantly connecting a field device to a basic module of each of the two peripheral devices. The invention also relates to a redundancy adapter unit for such an arrangement.

2. Description of the Related Art

Siemens catalog "ST PCS 7—June 2012", SIMATIC PCS 7 process control system, pages 8/2 to 8/6 discloses arrangements having peripheral devices. The peripheral devices in these arrangements are each provided with a multiplicity of assemblies mountable on a carrier, and are intended to connect the process peripherals to one or more automation devices. The assemblies usually each comprise a basic module (terminal module) and an electronic module, such as an electronic module comprising an I/O module, which can be plugged onto the basic module. Such a construction technique, with "fixed wiring", supports pulling and plugging of the I/O peripheral modules during ongoing operation. For this purpose, the respective basic module that is mountable on the carrier is provided with line connections or channels for wiring process lines, which means that a sensor and/or an actuator can be connected to the respective line connections via a suitable process line.

In the environment of automation technology, there is an increasing requirement for highly available solutions that are suitable for minimizing possible downtimes of the installation. For this purpose, it is necessary to also design the assemblies of the peripheral device(s) in a redundant manner in addition to the CPU or central unit of an automation device. Therefore, signals from a sensor that are to be processed with respect to the peripheral devices are transmitted to two assemblies, or control signals for an actuator are transmitted to this actuator by two assemblies at the same time, where the wiring is effected such that a line connection of a basic module of one assembly is connected or short-circuited to the corresponding, identical, or matching line connection of a basic module of the other assembly using a line, and the sensor or actuator line is connected to one of these two line connections. In this context, the terms "corresponding, identical and matching" relate to the number, the positioning, the intended purpose, as well as to the mechanical and electrical design of the line connections of the basic modules.

If a field device (e.g., a sensor, an actuator or a measuring transducer) is intended to be redundantly operated in an assembly of a first peripheral device and in an assembly of a second peripheral device, it is possible to use a MTA terminal module which is known from the Siemens catalog "ST PCS 7". The assemblies are connected, via two cables in the form of Y cabling, to the terminal module, to which the field device is connected, on the process side, via a connection cable. Here, the disadvantage is that this MTA terminal module is usually mounted on a top-hat rail and a separate space in a switchgear cabinet or in an installation must therefore be provided for this module.

SUMMARY OF THE INVENTION

It is an therefore an object of the invention to simplify the redundancy connection of assemblies, which are arranged in spatially separate peripheral devices, in the above-described arrangement. In addition, it is also an object to provide a suitable redundancy adapter unit for such an arrangement.

These and other objects and advantages are achieved in accordance with the invention by providing an arrangement having a first peripheral device and a second peripheral device that each include basic modules that are provided with process connections for accommodating electronic modules, where a redundancy adapter unit is provided for redundantly connecting a field device to each one of the basic modules of the two peripheral devices.

It is advantageous that the redundancy adapter unit can be used to redundantly connect both two assemblies inside one peripheral device and two assemblies of two different peripheral devices, in which case, there is no need for any additional space requirement for an MTA terminal module in contrast to the prior art. The connection module occupies a basic module that is present anyway, in which case a user can immediately discern which assembly is redundantly connected to another assembly in the one peripheral device in which the connection module is mounted. It is also advantageous that only one cable is needed to connect the connection module to the assembly of the other peripheral device.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention, its refinements and advantages are explained in more detail below using the drawing which illustrates an exemplary embodiment of the invention and in which.

DETAILED DESCRIPTION OF THE PREFERRED EMBODIMENTS

Figure 2:
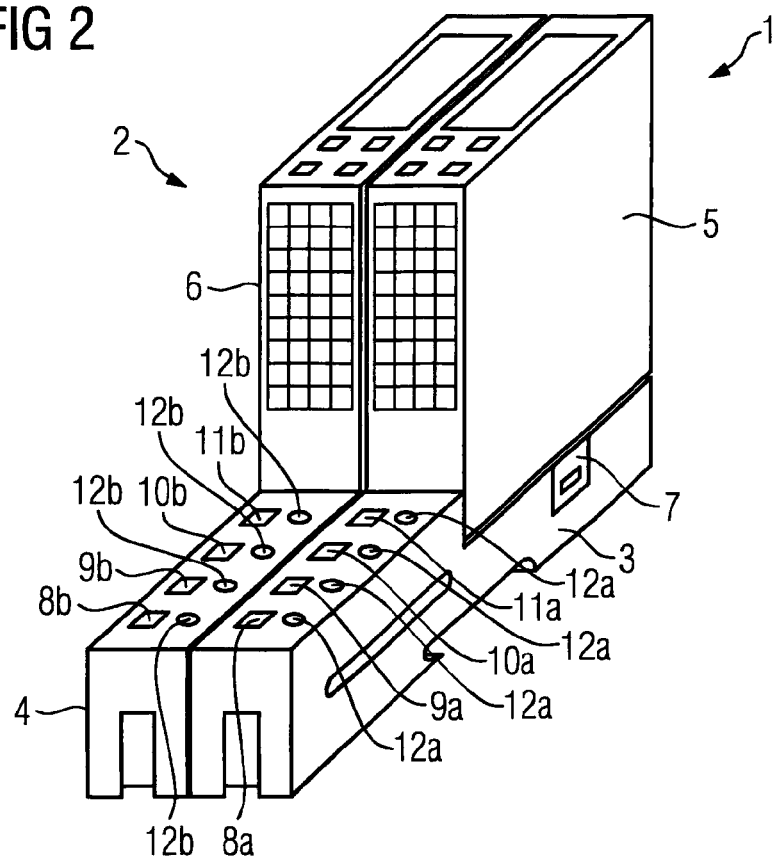
FIG. 2 shows assemblies of the peripheral devices of FIG. 1.

Reference is first of all made to FIG. 2 which illustrates two assemblies 1, 2 which can be mounted on a carrier (not shown). These assemblies may be arranged in one peripheral device, or may be arranged in a spatially separate manner in one of two peripheral devices in each case. The assemblies 1, 2 each have a basic module 3, 4 that is fitted, for example, with an electronic module comprising an input module 5, 6. The basic modules and therefore the assemblies of the peripheral devices are connected to one another via a bus, which is indicated in the present exemplary embodiment using a bus connecting device 7. In the present exemplary embodiment, each basic module 3, 4 has four matching process or line connections 8a to 11a, 8b to 11b for connecting four sensors (not shown) via sensor lines that are fastened in the line connections 8a to 11a, 8b to 11b using screws 12a, 12b. It should be understood that other connecting techniques, such as spring clamps, can be provided to connect the lines to the basic modules. The respective line connections 8a to 11a make contact with the input module 5 and the respective line connections 8b to 11b make contact with the input module 6 via suitable electrical connections of the basic modules 3, 4.

In order to be able to easily connect a sensor to the line connections of two basic modules or two assemblies of spatially separate peripheral devices in a redundant manner, a redundancy adapter unit is provided.

Figure 1:
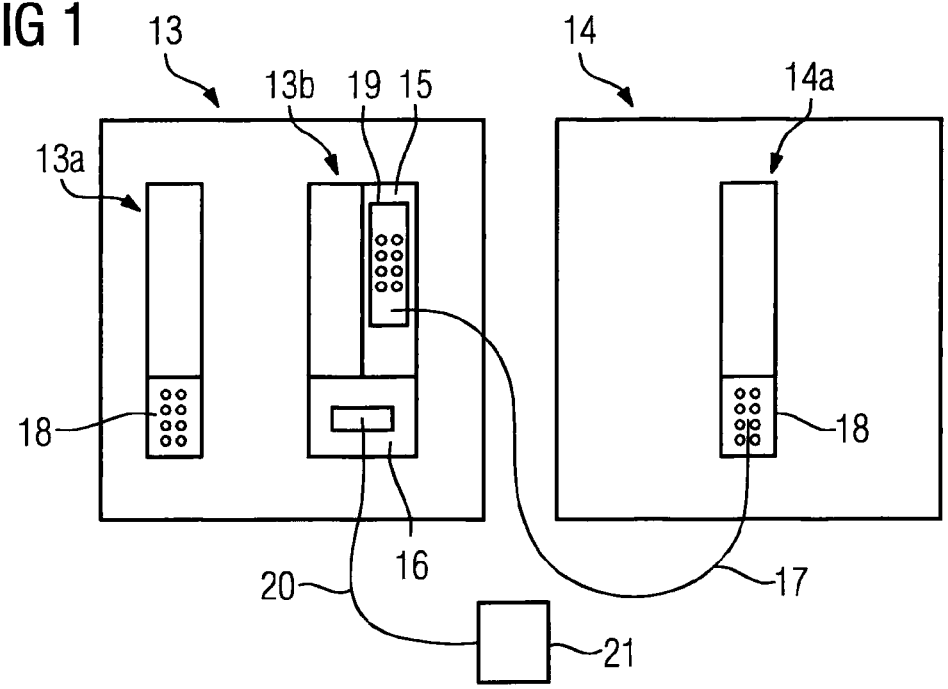
FIG. 1 shows an arrangement having two peripheral devices in accordance with the invention.

For a more detailed explanation, reference is made below to FIG. 1 which illustrates an arrangement having two peripheral devices. A first peripheral device 13 and a second peripheral device 14 have a multiplicity of assemblies which, as described, each consist of a basic module provided with process connections and an electronic module plugged onto the basic module, where the basic modules are connected to one another via a bus (not shown). For purposes of simplicity, only assemblies 13a, 13b of the first peripheral device 13 and an assembly 14a of the second peripheral device 14 are illustrated in the present exemplary embodiment. A redundancy adapter unit has a connection module 15, a redundancy adapter 16 that is plugged onto the process connections of the basic module of the assembly 13b and onto the basic module of the connection module 15, and a connecting cable 17 that is connected to this connection module 15. This connecting cable 17 connects the process connections 18 of the basic module of the assembly 14a to corresponding connections 19 of the connection module 15, the connecting cable 17 having a plug for connection to the process connections of the assembly 14a. In turn, the connections 19 are connected to the corresponding process connections of the basic module of the connection module 15 that are in turn connected to the corresponding process connections of the basic module of the assembly 13b using the redundancy adapter 16. In other words, the process and line connections of the basic module of the assembly 13b of the first peripheral device 13 are connected to the corresponding process connections 18 of the basic module of the assembly 14a of the second peripheral device 14 using the redundancy adapter 16, the connection module 15 and the connecting cable 17, as a result of which a sensor 21 connected to the redundancy adapter 16 via a cable 20 is redundantly connected to the assemblies 13a, 14a.

It should be understood that the connection module 15 which is provided with the connections 19 and whose dimensioning corresponds to that of an electronic module may comprise a connection plug. Here, it must be ensured that the plug is "correctly" plugged onto the basic module, with the result that the connections of this plug make contact with the connections of the basic module which correspond to the connections.

It should also be understood that the redundancy unit can also be used to redundantly connect the sensor 21 to two assemblies of the peripheral device 13 or 14. If the sensor 21 is to be redundantly connected to the assemblies 13a, 13b, the cable 17 is connected to process connections of the basic module of the assembly 13 instead of to the process connections 18.

If the sensor 21 is to be redundantly connected to the assembly 13b and to an assembly arranged directly adjacent to this assembly 13b, it is possible to dispense with the connection module 15 and the connecting cable 17. Here, the redundancy adapter 16 uses the process connections of the basic module of the assembly 13a to make contact with the basic module of the adjacent assembly. For example, an electronic module is plugged onto the basic module instead of the connection module 15, as a result of which the process connections of this assembly are connected to those of the assembly 13b.

The discloses embodiments of the invention thus comprise an arrangement having a first peripheral device 13 and a second peripheral device 14 each having basic modules 3, 4 that are provided with process connections 18 and are intended to accommodate electronic modules 5, 6, where a redundancy adapter unit is provided for redundantly connecting a field device 21 to one of the basic modules of each of the two peripheral devices 13, 14. The redundancy adapter unit has: (i) a redundancy adapter 16 for connecting the field device 21 and for making direct contact with the process connections 18 of the basic module of one of the peripheral devices 13 and with the process connections of a basic module adjacent to this basic module, (ii) a connection module 15 or a connection plug for making contact with one of the basic modules of one peripheral device 13 with which the redundancy adapter 16 makes contact, and (iii) a connecting cable 17 that makes contact with the connection module 15 or the connection plug and is intended for connection to the process connections 18 of the basic module of the other peripheral device 14.

The redundancy connection of assemblies 13b, 14a, which are arranged in spatially separate peripheral devices 13, 14, is simplified using such measures.

Thus, while there have shown, described, and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An arrangement comprising:
   a first peripheral device;
   a second peripheral device, the first and second peripheral devices each having a plurality of basic modules which are provided with process connections and which accommodate electronic modules; and
   a redundancy adapter unit for redundantly connecting an externally located field device to a basic module of the plurality of basic modules of each of the first and second peripheral devices;
   wherein the redundancy adapter unit comprises:
      a redundancy adapter for connecting the field device and for directly contacting the process connections of the basic module of one of the first and second peripheral devices and with the process connections of the basic module adjacent to said basic module basic module of one of the first and second peripheral devices;
      a connection module or a connection plug for contacting the basic module of one of the first and second peripheral devices with which the redundancy adapter makes contact; and
      a connecting cable which contacts the connection module or the connection plug for connection to the process connections of the basic module of another peripheral device of the first and second peripheral devices.

2. A redundancy adapter unit for an arrangement comprising a first peripheral device, a second peripheral device, the first and second peripheral devices each having a plurality of basic modules which are provided with process connections and which accommodate electronic modules, the redundancy adapter unit comprising:

- a redundancy adapter for connecting an externally located field device and for directly contacting the process connections of the basic module of one of the first and second peripheral devices and with the process connections of the basic module adjacent to said basic module basic module of one of the first and second peripheral devices;
- a connection module or a connection plug for contacting the basic module of one of the first and second peripheral devices with which the redundancy adapter makes contact; and
- a connecting cable which contacts the connection module or the connection plug for connection to the process connections of the basic module of another peripheral device of the first and second peripheral devices;
- wherein the redundancy adapter unit redundantly connects the field device to the basic module of the plurality of basic modules of each of the first and second peripheral devices.

* * * * *